(12) United States Patent
Miller et al.

(10) Patent No.: US 6,459,586 B1
(45) Date of Patent: Oct. 1, 2002

(54) SINGLE BOARD POWER SUPPLY WITH THERMAL CONDUCTORS

(75) Inventors: Gerald Miller, Chelmsford, MA (US); William Ng, Leominister, MA (US); Bernhard Schroter, Upton, MA (US)

(73) Assignee: Galaxy Power, Inc., Westborough, MA (US)

( * ) Notice: Subject to any disclaimer, the term of this patent is extended or adjusted under 35 U.S.C. 154(b) by 0 days.

(21) Appl. No.: 09/638,599

(22) Filed: Aug. 15, 2000

(51) Int. Cl.[7] ................................................. H05K 7/20
(52) U.S. Cl. ........................ 361/719; 174/252; 336/61
(58) Field of Search ........................ 361/690, 703–705, 361/709–713, 717–719, 740, 750, 752, 758; 174/16.3, 252; 165/80.3, 185; 363/141; 336/200, 232, 90, 61

(56) References Cited

U.S. PATENT DOCUMENTS

| | | | |
|---|---|---|---|
| 3,686,533 A | * 8/1972 | Garnier et al. | 361/719 |
| 4,739,448 A | * 4/1988 | Rowe et al. | 361/719 |
| 5,072,332 A | 12/1991 | Abe | |
| 5,210,513 A | 5/1993 | Khan et al. | |
| 5,473,511 A | * 12/1995 | Reddy et al. | 361/719 |
| 5,506,755 A | * 4/1996 | Miyagi et al. | 361/720 |
| 5,576,934 A | * 11/1996 | Roethlingschoefer | |
| 5,619,399 A | * 4/1997 | Mok | 361/707 |
| 5,973,923 A | * 10/1999 | Jitaru | 361/704 |
| 6,038,137 A | * 3/2000 | Bhatt et al. | 361/795 |
| 6,175,500 B1 | * 1/2001 | Roy | 361/719 |
| 6,222,733 B1 | 4/2001 | Gammenthaler | |

OTHER PUBLICATIONS

"Heat Dissipation—Package", IBM Tech Discl Bull. vol. 16 No. 11 Apr.–1977, Balderes, pp. 4165.*
Photographs of supply module sold by Galaxy Power, Inc. prior to Aug. 15, 2000.

* cited by examiner

Primary Examiner—Gerald Tolin
(74) Attorney, Agent, or Firm—Cesari and McKenna, LLP

(57) ABSTRACT

A power supply module for a computer is provided. The module includes a multilayer pc board, heat generating electrical components disposed on the board, logic elements disposed on the board and a heat sink. The module also includes thermal conducting structure disposed coupled to the pc board and thermally coupled to the heat sink and to the heat generating electrical components for transferring heat from the heat generating electrical components to the heat sink.

21 Claims, 9 Drawing Sheets

SINGLE BOARD POWER SUPPLY WITH THERMAL CONDUCTORS

BACKGROUND OF THE INVENTION

1. Field of the Invention

This invention relates to power supply boards for computers, and more particularly, for power supply boards with structure for conducting heat away from the board.

2. Background Information

Power supply modules for computers include pc boards having many electrical components which generate heat. If the generated heat is not removed from the module it will damage the modules and/or its components.

In the past, attempts to transfer heat have resulted in bulky, complicated modules. For example, one prior art supply module included a dual pc board construction. The first pc board was an insulated metal base layer where the heat generating electrical components were coupled to one side of the board and a heat sink was bonded directly to the other side of the board which left no room to mount any components. Since only one side of the board could mount components, less components could be put on the board and a second multilayer pc board containing the remaining circuitry and components was required. The two pc boards were electrically connected by pins or wires between the two boards. This construction was bulky and was expensive to manufacture.

SUMMARY OF THE INVENTION

It is a general object of the invention to provide an improved power supply module for a computer which avoids the disadvantages of prior modules, while affording additional structural and operational advantages.

An important feature of the invention is the provision of a power supply module which is of relatively simple and economical construction.

A further feature of the invention is the provision of a power supply module of the type set forth which requires only one pc board.

Another feature of the invention is the provision of a module of the type set forth which uses the electrical circuitry of the pc board to transfer heat away from the board.

A still further feature of the present invention, in connection with the above feature, is the utilization of the copper layers of the pc board to spread the heat laterally along the plane of the board to vias which transfer the heat perpendicular to the plane of the pc board away from heat generating elements.

Another feature of the invention is the provision of a module of the type set forth which uses heat generating electrical components to transfer heat generated from other components away from the board.

Certain ones of these or other features may be attained by providing a power supply ply module for a computer which includes a multilayer pc board, heat generating electrical components disposed on the board, logic elements disposed on the board, and a heat sink. The module also includes thermal conducting structure disposed on the pc board and thermally coupled to the heat sink and to the heat generating electrical components for transferring heat from the heat generating electrical components to the heat sink.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DETAILED DESCRIPTION OF AN ILLUSTRATIVE EMBODIMENT

Figure 1:
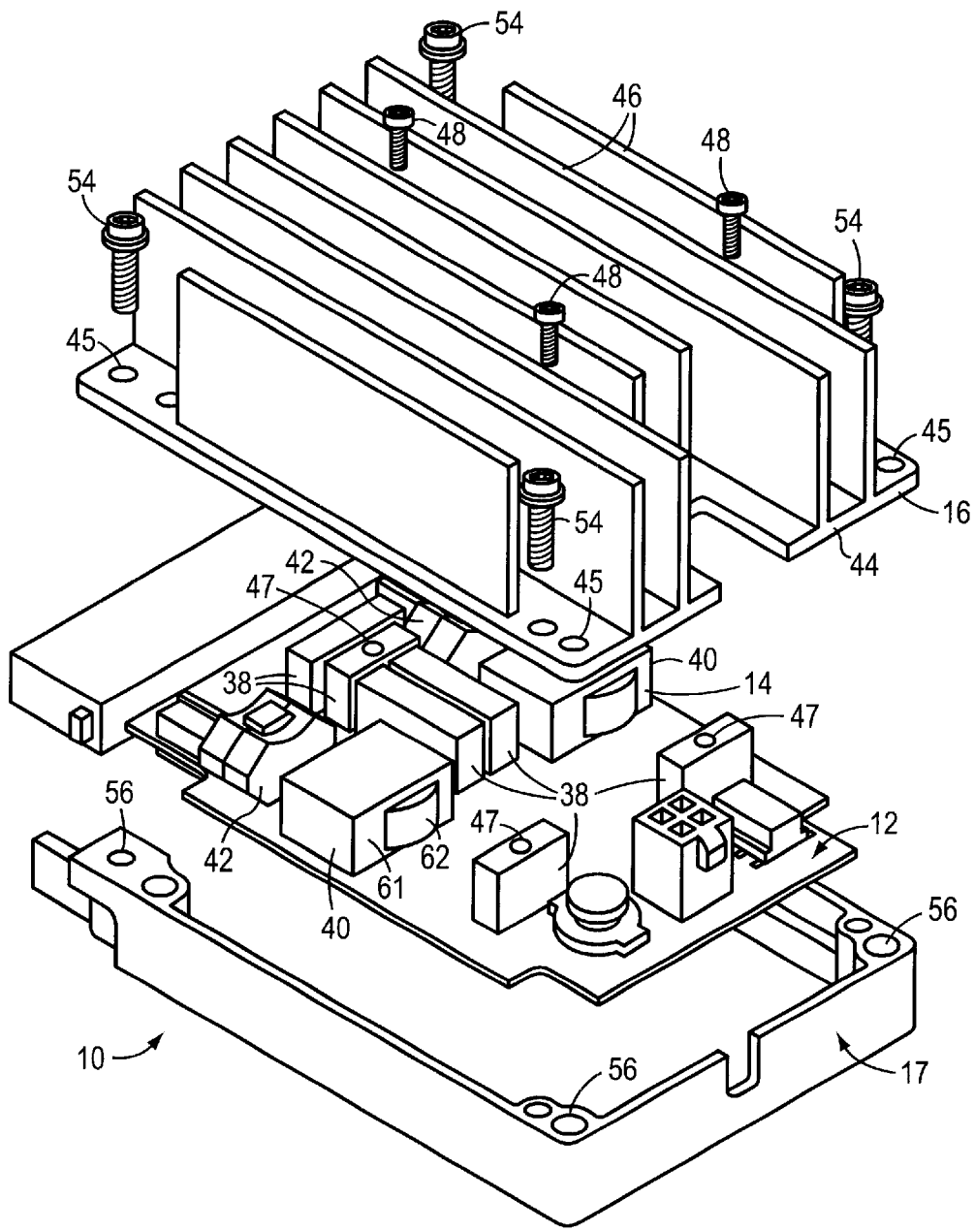
FIG. 1 is an exploded perspective view of the power supply module of the present invention.
Figure 2:
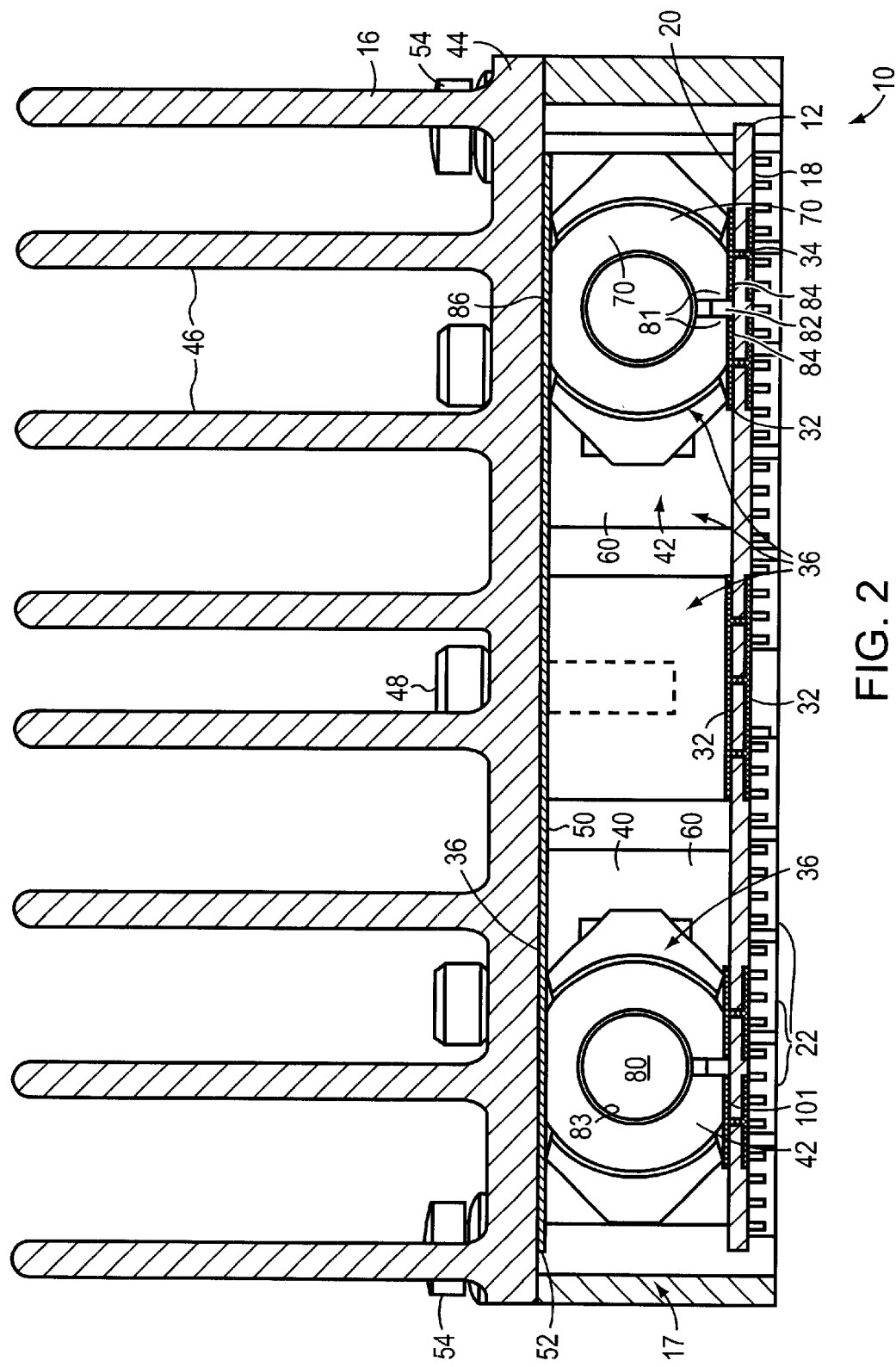
FIG. 2 is a sectional view of the assembled module of FIG. 1 where the upper and lower copper layers of the pc board have been shown for discussion purposes.

Referring to FIGS. 1 and 2, a power supply module 10 for a computer is shown. The power supply module 10 includes a multilayer printed circuit board ("pc board") 12, having power supply elements and logic control elements thereon. The power supply module 10 also includes thermal conducting structure 14, a heat sink 16, and a housing 17.

Figure 7:
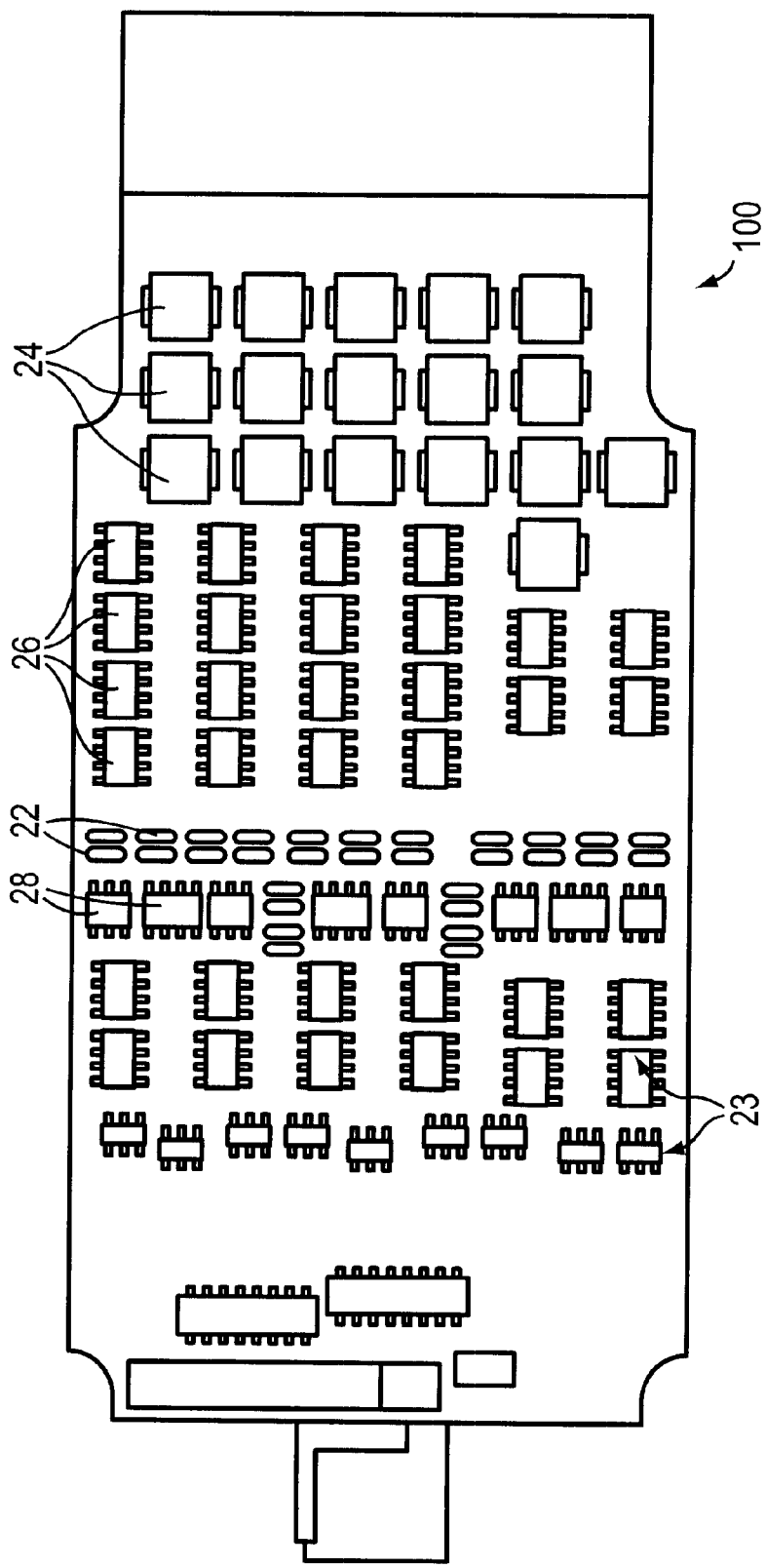
FIG. 7 is a bottom plan view of an alternative pc board of the present invention.
Figure 8:
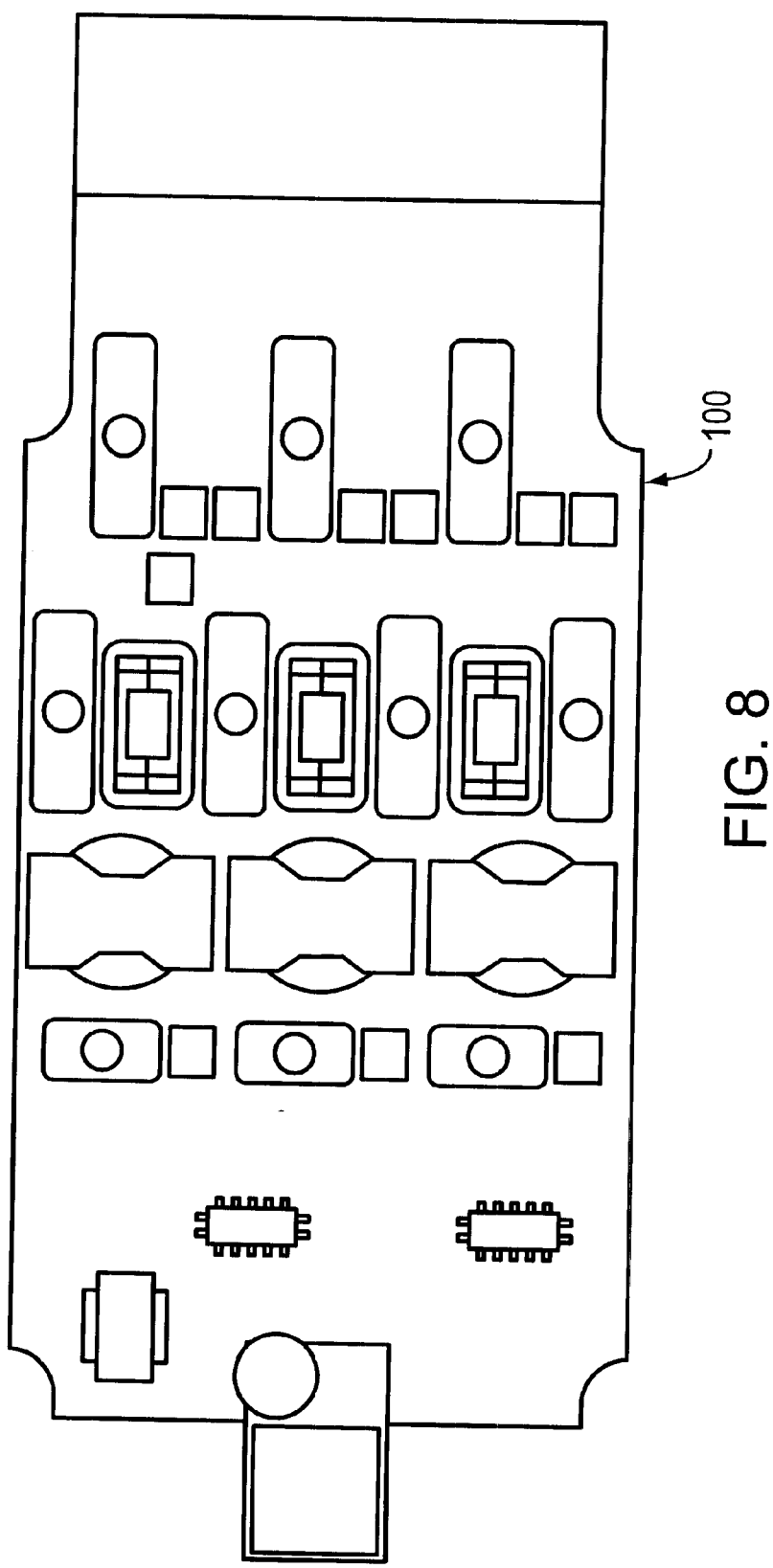
FIG. 8 is a top plan view of the alternative pc board of FIG. 7.

The pc board 12 has first and second generally parallel sides 18 and 20. On the first side 18, heat generating electrical elements 22 and logic elements 23 (see FIG. 7) are mounted. The heat generating elements 22 are usually low profile and may include, as seen in FIG. 7, where an alternative pc board 100 is shown, capacitors such as output tantalum capacitors 24 and transistors, such as synchronous FETs 26 and switching transistors 28. As seen best in FIG. 3, the heat generating electrical elements 22 have leads 30 mounted to the surface of the first side 18 of the pc board 12 by solder or the like. The heat generating electrical element 22 is typically encapsulated in a plastic housing.

Figure 3:
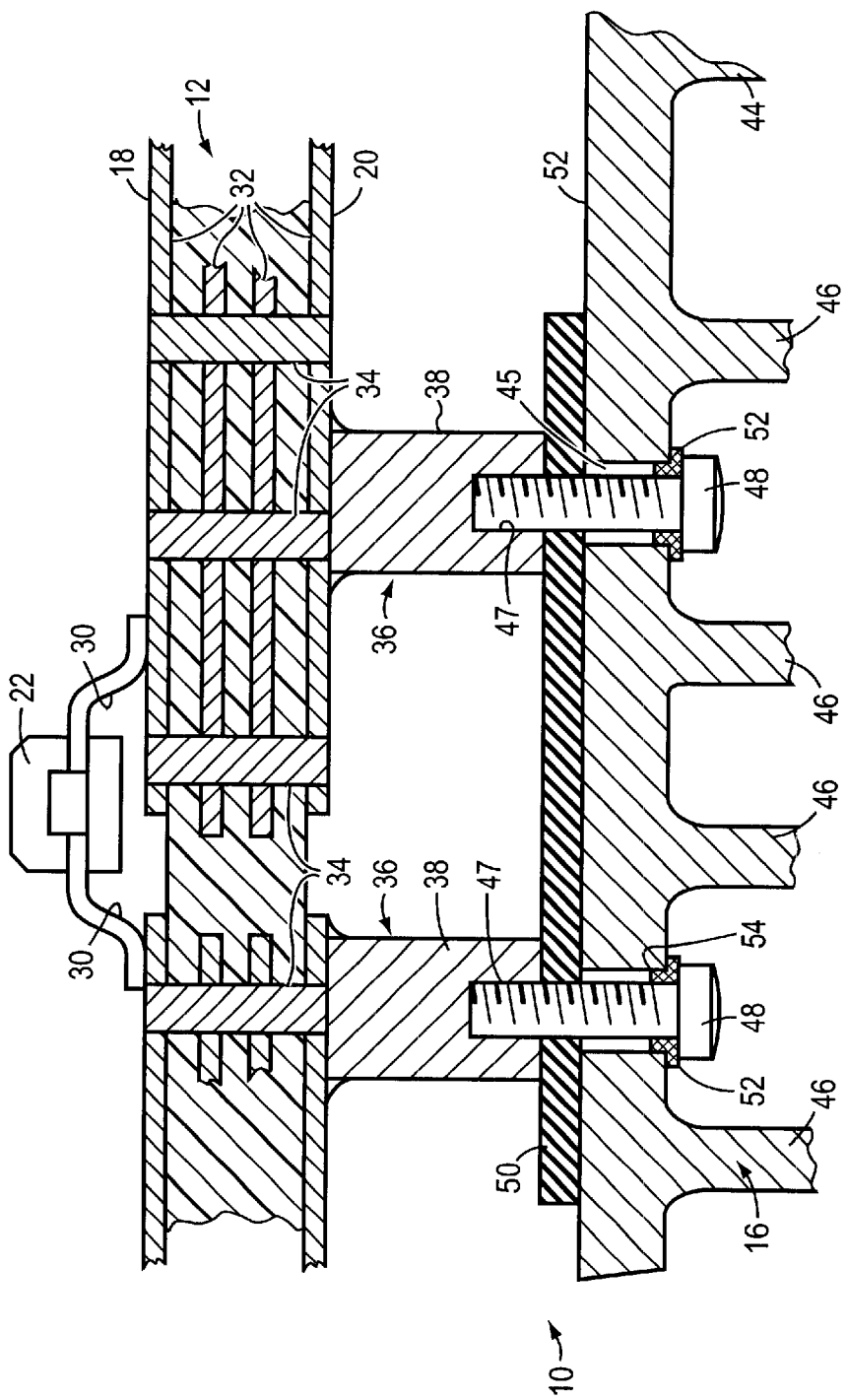
FIG. 3 is an enlarged diagrammatic sectional view illustrating the heat and electrical flow from an electrical component through the module.

As seen in FIG. 3, the pc board 12 is an industry standard pc board formed of FR4 material and in an exemplary embodiment of the invention has four copper layers 32 each having a basis weight of copper of about two ounces per square foot. The layers 32 are preferably about 0.006 inches thick and generally parallel to one another. The pc board 12 also includes hundreds of thermal vias 34 spaced throughout the entire pc board 12. The thermal vias 34 are metal plated, preferably copper plated, through holes running from the first side 8 to the second side 20. The diameter of the thermal vias 34 are preferably greater than the thickness of the copper layers 32, such as 0.025 inches. The thermal vias 34 are filled with solder and are electrically connected to the copper layers 32. Together the thermal vias 34 and the copper layers 32 form an electrical circuit.

The thermal conducting structure 14 is formed by the electrical circuit and thermal conducting member 36 disposed on the second side 20 of the pc board 12.

As seen in FIGS. 1 and 2, the thermal conducting members 36 includes thermally conducting block 38, and heat generating elements including transformers 40 and inductors 42. Each of the thermally conducting members 36 is formed at least in part by a thermally conductive material, such as a metal and/or a ferrite core in the case of the transformers 40 and inductors 42.

As seen in FIGS. 1–3, the heat sink 16 is of conventional construction and includes a base 44 with a plurality of holes 45 and a plurality of fins 46 attached to the base 44. The heat sink 16 is attached to and thermally coupled to the thermally conductive members 36 by a plurality of bolts 48 respectively passing through holes 45 in the heat sink 16 and into threaded apertures 47 in the thermally conducting blocks 38. The heat sink 16 is electrically isolated from the remainder of the module 10 by a thermally conductive, electrically isolating mat 50 disposed between the thermal conducting structures 36 and the heat sink 16. The mat 50 can be formed of a material such as silicone polymer filled with ceramic powder. A preferred mat is a 0.5 mm mat made by Alfatec Kerafol GBH, a division of MH&W of Mahwah, N.J. sold under the designation "Softtherm/Keratherm 86/200K." The heat sink 16 is also electrically isolated by placing a washer 52 with a shoulder about each of the bolts 48 so the bolts 48 do not contact the sides of the oversize hole 45.

As seen in FIGS. 2 and 3, the heat sink 16 includes a generally planar bottom surface 52, which is substantially parallel to the second side 20 of the pc board 12 to define a gap 54 therebetween. The thermal conducting members 36 each has a height substantially equal to the gap 54 to place the thermal conducting members 36 in thermal contact with both the electrical circuit formed by the thermal vias 34 and copper layers 32 and the heat sink 16.

As seen in FIGS. 1 and 2, the coupled heat sink 16, thermal conducting structure 14 and pc board 12 are attached to the housing 17 by a plurality of bolts 54 respectively passing through holes 45 in the heat sink 16 and into threaded apertures 56 in the housing 17.

The power supply module 10 of the present invention runs at high power. Typically input power is between about 150 to about 200 watts, and output power is typically from about 120 to about 180 watts. Operation of the power supply is about 80% efficient. The power loss which equates to the heat given off the during operation is thus between about 30 to about 40 watts. Thus, the power supply module 10 requires an efficient way of conducting this heat generated by the power loss away from the pc board.

The power supply module 10 conducts heat away from the heat generating electrical elements 22 as follows. Referring to FIG. 3, the heat generating electrical element 22 generates heat which is transferred through its leads 30 to the uppermost copper layer 32 which transfers the heat laterally along the plane of the copper layer 32 to one or more vias 34 which transfers the heat vertically away from the heat generating electrical element 22 directly to a thermally conducting structure 36, such as a thermal conducting block 38, as shown in FIG. 3, or to the bottom-most copper layer 32 at the second side 20 of the pc board 12 which laterally transfers the heat to one or more of the thermally conducting members 36. The thermally conducting members 36 transfer the heat vertically away from the heat generating electrical elements 22 toward the heat sink 16 and into the mat 50 which spreads the heat both laterally and vertically into the heat sink 16 and then into the air.

Figure 4:
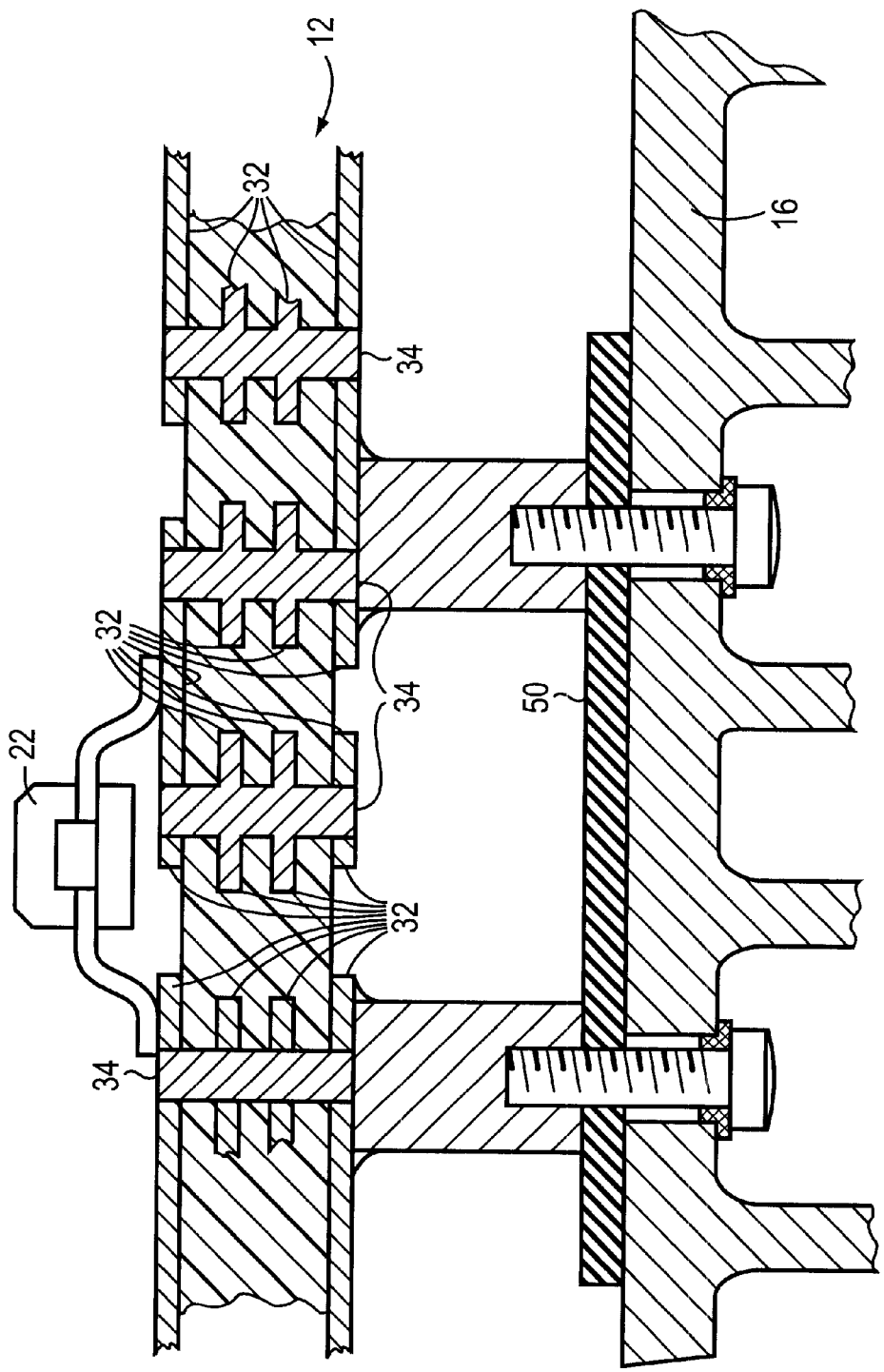
FIG. 4 is a view similar to FIG. 3, illustrating the heat and electrical paths from another electrical component through the module.

Thus, the copper layers 32 spread the heat laterally, or parallel to the first and second sides 18, 20, and the vias 34 conduct the heat vertically, or perpendicular to the first and second sides, 18, 20, from the first side 18 to the second side 20. (FIG. 4 shows where some of the copper layers 32 are not thermally or electrically connected to some of the vias 34.)

As discussed above, the thermal conducting members 36 can include heat generating components such as transformers 40 and inductors 42 formed, at least in part, by thermally conductive material. As seen in FIGS. 1 and 2, the transformer 40 includes windings 62 and a box-like housing 60 made of ferrite. The ferrite housing 60 transfers heat from the vias 34 and copper layers 32 to the mat 50.

Figure 5:
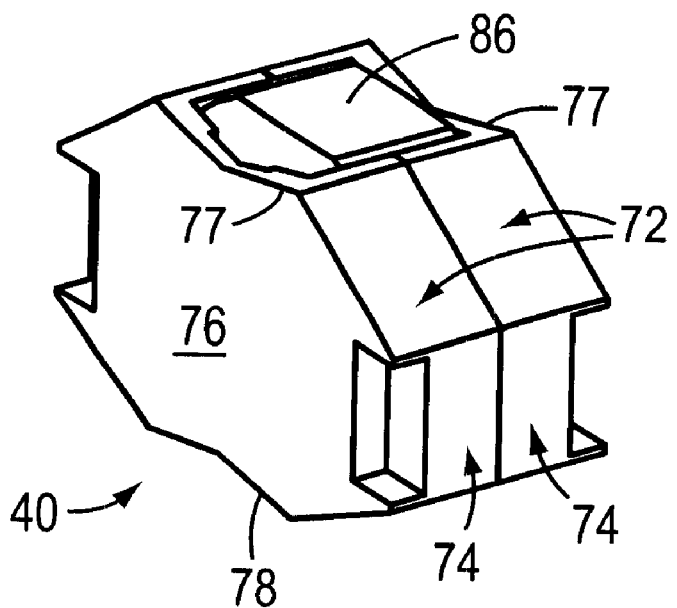
FIG. 5 is a perspective of the inductor of the present invention.
Figure 6:
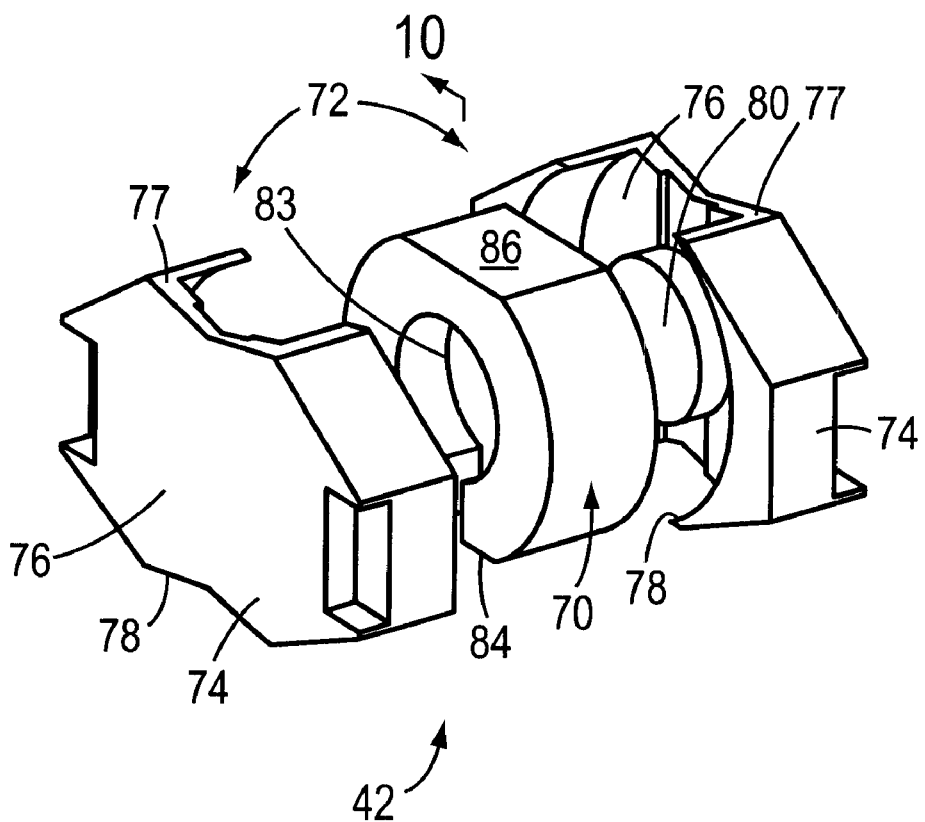
FIG. 6 is an exploded perspective view of the inductor of FIG. 5.

Similarly, the inductors 42 transfer heat. Referring to FIGS. 5 and 6, inductors 42 of the present invention are a three piece construction including a unitary one-turn winding 70 (the winding may be more than one turn if necessary) and a two piece housing 72 formed of identical housing halves 74 made of ferrite. Each half 74 has a side wall 76 and mirror image upper and lower walls 77, 78 and a cylindrical post 80 projecting inwardly from the side wall 76.

Transformer housing 60 and inductor housing 72 may be made of any suitable magnetically permeable material. For example, the housings may be made of ferrite material as commonly used in electrical arts. Alternatively, the housings 60, 72 may be made of powdered iron disposed in a suitable matrix, etc. Hereinafter, the magnetically permeable material will be referred to as "ferrite" for convenience.

Figure 10:
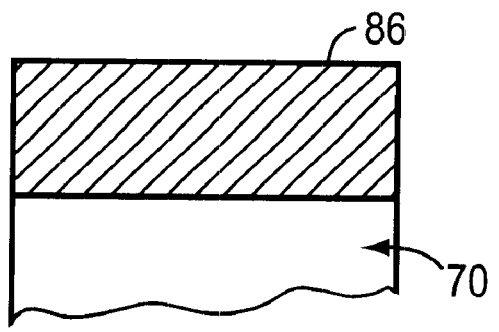
FIG. 10 is an enlarged sectional view taken generally along line 10—10 of FIG. 6.

The winding 70 is a one-piece construction formed preferably of brass having a metal content of 5 to 10 times more than is needed for conducting electrical current. In this respect, the smallest cross-sectional area, as seen in FIG. 10, of the winding is 5 to 10 times greater than is needed for conducting electrical current. Brass is preferred because it is easily soldered and is a good electrically conductive material. The winding 70 is generally cylindrical and has two ends 81 which define a slot 82. The winding 70 also defines a central hole 83. The winding 70 has a planar broken bottom end surface 84 for conducting heat and electricity, surface 84 is generally parallel to the planar upper surface 86 when conducts heat.

Referring to FIGS. 2, 5 and 6, the winding 70 is disposed between the two housing halves 74 where each of the cylindrical posts 80 are disposed in the hole 83 of the winding 70 and the upper and bottom surfaces 86, 84 of the winding 70 respectively extend through generally rectangular holes formed by the associated upper and lower walls 77, 78 of the housing halves 74.

Figure 9:
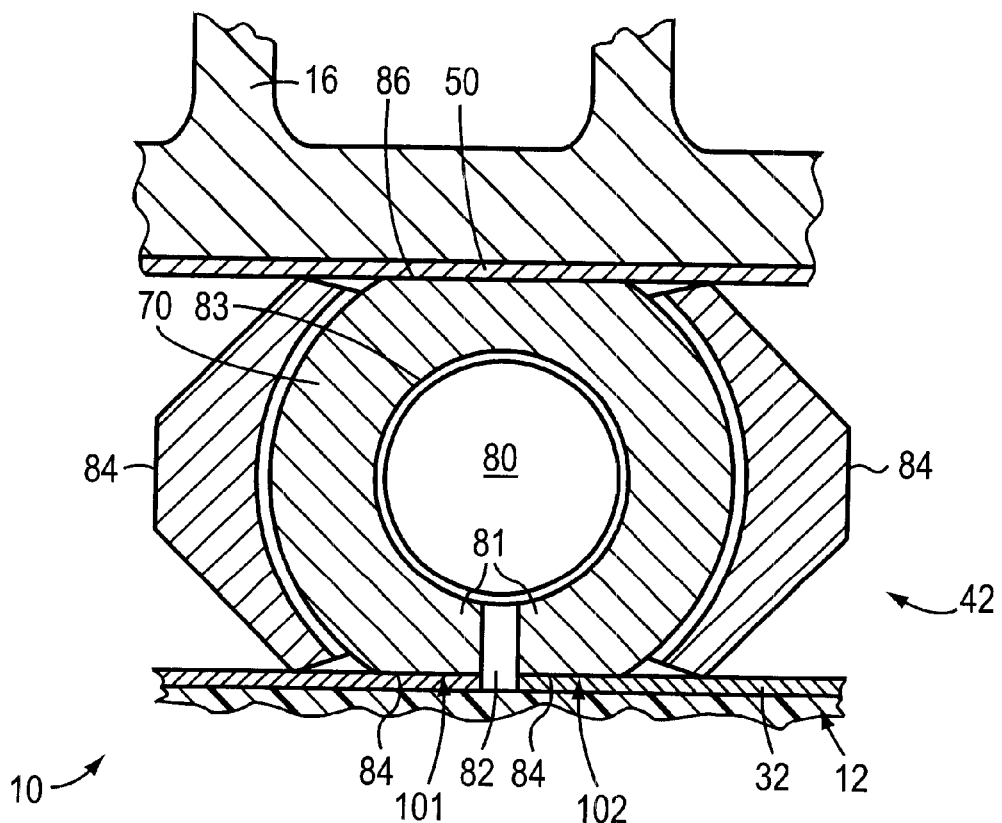
FIG. 9 is an enlarged view of a portion of FIG. 2.

As seen in FIGS. 2 and 9, each portion of the lower surface 84 is in thermal and electrical contact with the uppermost copper layer 32 and several vias 34 forming electrical connections 101 and 102 therebetween. The upper surface 86 is in thermal contact with the mat 50. Thus, the winding 70 not only transmits current but transfers heat from the heat generating electrical elements 22 toward the heat sink 16. Current flows around through the winding 70 from connection 101 to connection 102, or vice versa, while heat flows through the winding 70 from connections 101, 102 to the surface 86. Heat flow also occurs through the ferrite housing halves 84 from the pc board 12 toward heat sink 16.

Referring to FIG. 2, the winding 70 has an axis which is substantially parallel to the first and second sides 18, 20 of the pc board 12.

While particular embodiments of the. present invention have been shown and described, it will be appreciated by those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A power supply module for a computer comprising;
   a generally planar pc board having a first side and a second side;
   heat generating electrical components disposed on the first side of the board;
   a magnetic induction device having a fist side and a second side, the first side of the magnetic induction device attached to the second side of the board;
   a plurality or thermal vias through the board arranged substantially perpendicular to the plane of the board, the vias thermally couple the heat generating electrical components to the first side of the magnetic induction device; and
   a heat sink thermally connected to the second side of the magnetic induction device,
   wherein heat flows substantially perpendicular to the plane of the board from the heat generating electrical components on the first side of the board, through the thermal vias to the second side of the board, into the first side of the magnetic induction device, and out the second side of the magnetic induction device to the heat sink.

2. The module of claim 1, wherein solder is disposed through the thermal vias.

3. The module of claim 1, wherein the pc board includes a set of spaced apart electrical and thermal conducting layers generally parallel to the plane of the board and perpendicular to the vias, the set electrically and thermally coupled to the vias and the heat generating electrical components, whereby heat generated by the heat generating electrical components is transferred laterally along the plane of the board to one or more of the vias.

4. The module of claim 3, wherein the thermally conducting layers are formed of copper having a basis weight of 2 ounces per square foot.

5. The module of claim 1, wherein the magnetic induction device includes a housing made of thermally conductive material.

6. The module of claim 1, wherein the magnetic induction device is a transformer.

7. The module of claim 1, wherein the magnetic induction device is an inductor.

8. The module of claim 1, wherein the heat sink and the second side of the pc board form a gap and the magnetic induction device is shaped and dimensioned to substantially bridge the gap.

9. The module of claim 8, wherein the heat sink includes a substantially planar base surface substantially parallel to the second side of the pc board to define the gap therebetween.

10. The module of claim 1, wherein the module is shaped and designed to handle input power of at least about 150 watts and output power of at least about 120 watts.

11. The module of claim 1, further comprising a single turn coil in the magnetic induction device, the coil thermally attached to the second side of the board and to the heat sink.

12. A power supply module for a computer comprising:
   a generally planar pc board having first and second sides and an electrical circuit;
   heat generating electrical components disposed on the first side of the board;
   a magnetic induction device having a first side and a second side, the first side of the magnetic induction device attached to the second side of the board;
   a plurality of thermal vias through the board, arranged substantially perpendicular to the plane of the board, the vias thermally couple the heat generating electrical components to the first side of the magnetic induction device; and
   a heat sink thermally connected to the second side of the magnetic induction device,
   wherein heat flows substantially perpendicular to the plane of the board from the heat generating electrical components on the fire side of the board, through the electrical circuit to the thermal vias, through the thermal vias to the second side of the board, into the first side of the magnetic induction device, and out the second side of the magnetic induction device to the heat sink.

13. The module of claim 12, wherein solder is disposed through the thermal vias.

14. The module of claim 12, wherein the pc board includes a set of spaced apart electrical and thermal conducting layers generally parallel to the plane of the board and perpendicular to the vias, the set electrically and thermally coupled to the vias and the heat generating electrical components, whereby heat generated by the heat generating electrical components is transferred laterally along the plane of the board to one or more of the vias.

15. The module of claim 12, wherein the magnetic induction device includes a housing made of thermally conductive material.

16. The module of 12, wherein the magnetic induction device is a transformer or an inductor.

17. The module of claim 12, wherein the heat sink and the second side of the pc board form a gap and the magnetic induction device is shaped and dimensioned to substantially bridge the gap.

18. The module of claim 12, further comprising a single turn coil in the magnetic induction device, the coil thermally attached to the second side of the board and to the heat sink.

19. A power supply module for a computer comprising:
   a multilayer pc board having first and second sides;
   heat generating electrical components disposed on the first side of the board;
   a magnetic induction device having a first side and a second side, the first side of the magnetic induction device attached to the second side of the board;
   a plurality of thermal vias through the board, arranged substantially perpendicular to the plane of the board, the vias thermally couple the heat generating electrical components to the first side of the magnetic induction device; and
   a heat sink thermally connected to tile second side of the magnetic induction device,
   wherein heat flows from the heat generating electrical components on the first side of the board, through the thermal vias to the second side of the board, into the first side of the magnetic induction device, and out the second side of the magnetic induction device to the heat sink and to the air.

20. The module of claim 19, wherein the pc board includes a plurality of generally parallel thermal and electrical conducting layers thermally and electrically connected to the vias.

21. The module of claim 19, further comprising a single turn coil in the magnetic induction device, the coil thermally attached to the second side of the board and to the heat sink.

* * * * *